US012757697B2

(12) United States Patent
Fujita et al.

(10) Patent No.: US 12,757,697 B2
(45) Date of Patent: Oct. 6, 2026

(54) SUBSTRATE LIQUID PROCESSING METHOD, AND RECORDING MEDIUM

(71) Applicant: Tokyo Electron Limited, Tokyo (JP)

(72) Inventors: Keiichi Fujita, Kikuchi-gun (JP); Takashi Tanaka, Kikuchi-gun (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 393 days.

(21) Appl. No.: 18/557,144

(22) PCT Filed: Apr. 13, 2022

(86) PCT No.: PCT/JP2022/017685
§ 371 (c)(1),
(2) Date: Oct. 25, 2023

(87) PCT Pub. No.: WO2022/230668
PCT Pub. Date: Nov. 3, 2022

(65) Prior Publication Data

US 2024/0213090 A1 Jun. 27, 2024

(30) Foreign Application Priority Data

Apr. 26, 2021 (JP) ................................ 2021-074297

(51) Int. Cl.
*H10W 20/00* (2026.01)
*C23C 18/16* (2006.01)
*H10P 14/46* (2026.01)

(52) U.S. Cl.
CPC ....... *H10W 20/044* (2026.01); *C23C 18/1658* (2013.01); *C23C 18/166* (2013.01); *H10P 14/46* (2026.01)

(58) Field of Classification Search
None
See application file for complete search history.

(56) References Cited

U.S. PATENT DOCUMENTS

2017/0243762 A1 8/2017 Li et al.
2019/0169751 A1* 6/2019 Wendeln ................ C23C 18/40

FOREIGN PATENT DOCUMENTS

JP S56-123363 A 9/1981
JP H06-49649 A 2/1994
JP 2001-102448 A 4/2001
JP 2003-193249 A 7/2003
JP 2008-001963 A 1/2008
(Continued)

OTHER PUBLICATIONS

International Search Report for PCT/JP2022/017685 dated Jun. 14, 2022.

*Primary Examiner* — Anthony Ho
(74) *Attorney, Agent, or Firm* — Chrisman Gallo Tochtrop LLC

(57) ABSTRACT

A substrate liquid processing method includes preparing a substrate having a recess on a surface thereof, a seed layer being formed on a surface of the recess; bringing a first pretreatment liquid, containing a reducing agent, a pH adjuster, and an additive configured to accelerate or inhibit an electroless plating reaction, into contact with the seed layer; and precipitating, after the bringing of the first pretreatment liquid into contact with the seed layer, a plating metal in the recess by supplying a first electroless plating liquid to the recess.

4 Claims, 6 Drawing Sheets

(56) References Cited

FOREIGN PATENT DOCUMENTS

| | | | |
|---|---|---|---|
| JP | 2008-069389 | A | 3/2008 |
| JP | 2011-068954 | A | 4/2011 |
| JP | 2019-515138 | A | 6/2019 |
| WO | 2017/191260 | A1 | 11/2017 |

* cited by examiner

SUBSTRATE LIQUID PROCESSING METHOD, AND RECORDING MEDIUM

CROSS-REFERENCE TO RELATED APPLICATIONS

This Application is a U.S. national phase application under 35 U.S.C. § 371 of PCT Application No. PCT/JP2022/017685 filed on Apr. 13, 2022, which claims the benefit of Japanese Patent Application No. 2021-074297 filed on Apr. 26, 2021, the entire disclosures of which are incorporated herein by reference.

TECHNICAL FIELD

The various aspects and embodiments described herein pertain generally to a substrate liquid processing method and a recording medium.

BACKGROUND

Electroless plating technology is used to form fine wiring on a semiconductor substrate (wafer).

In a wiring forming method described in Patent Document 1, for example, a connection hole is formed in an insulating film, a diffusion barrier layer is deposited on an inner surface of the connection hole, a Cu seed layer is deposited on the diffusion barrier layer, and a Cu plating layer is filled in the connection hole by an electroless plating method.

Patent Document 1: Japanese Patent Laid-open Publication No. 2001-102448

SUMMARY

With the process of miniaturization of a wiring, it is becoming difficult to properly fill a fine recess (for example, a via or a trench) of a substrate with a plating metal.

In order to suppress formation of a void or a seam in the plating metal filled in the recess, it is effective to gradually precipitate the plating metal from the bottom of the recess. However, it is not easy to control the precipitation of the plating metal in the fine recess in such a bottom-up manner (rising manner).

Further, when the plating metal is precipitated on a seed layer, the seed layer needs to be thinned to meet the trend of miniaturization of the wiring. As the seed layer gets thinner, corrosion of the seed layer caused by an electroless plating liquid tends to have a larger effect on an electroless plating processing. In particular, immediately after the beginning of the electroless plating processing, no or almost no plating metal is precipitated, while the corrosion of the seed layer by the electroless plating liquid progresses. As a result, the seed layer may be thinned unintentionally.

Exemplary embodiments provide a technique advantageous for appropriately filling a recess of a substrate with a plating metal by an electroless plating processing.

In an exemplary embodiment, a substrate liquid processing method includes preparing a substrate having a recess on a surface thereof, a seed layer being formed on a surface of the recess; bringing a first pretreatment liquid, containing a reducing agent, a pH adjuster, and an additive configured to accelerate or inhibit an electroless plating reaction, into contact with the seed layer; and precipitating, after the bringing of the first pretreatment liquid into contact with the seed layer, a plating metal in the recess by supplying a first electroless plating liquid to the recess.

According to the exemplary embodiment, it is possible to provide a technique advantageous for filling a recess of a substrate with a plating metal appropriately by an electroless plating processing.

DETAILED DESCRIPTION

Hereinafter, an exemplary embodiment of the present disclosure will be described with reference to the accompanying drawings.

Figure 1:
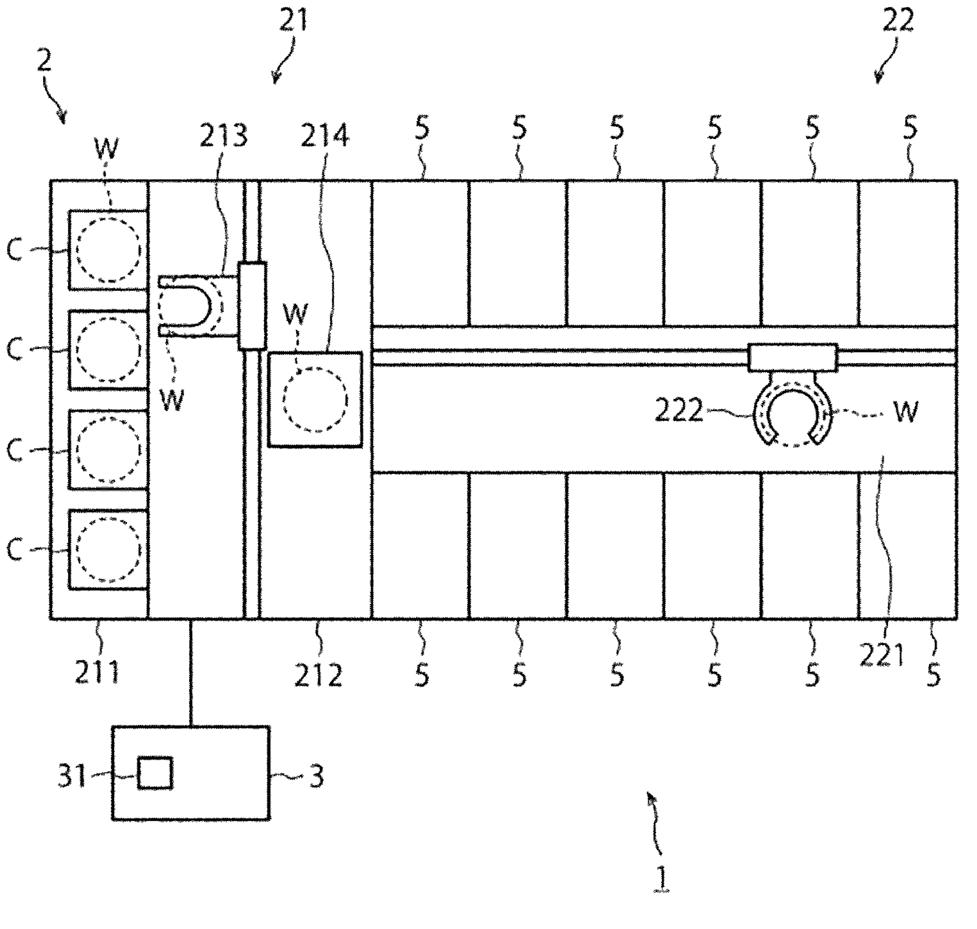
FIG. 1 is a schematic diagram illustrating a plating apparatus as an example of a substrate liquid processing apparatus according to an exemplary embodiment.

FIG. 1 is a schematic diagram illustrating a plating apparatus as an example of a substrate liquid processing apparatus according to the exemplary embodiment.

A plating apparatus 1 is an apparatus configured to perform a plating processing (liquid processing) on a substrate W by supplying a plating liquid (processing liquid) to the substrate W. The plating apparatus 1 shown in FIG. 1 is equipped with a plating unit 2 and a controller 3 configured to control the plating unit 2.

The plating unit 2 performs various processings on the substrate W. The various processings performed by the plating unit 2 will be described later.

The controller 3 is, for example, a computer, and has an operation execution unit and a storage. The operation execution unit includes, for example, a CPU (Central Processing Unit), and controls an operation of the plating unit 2 by reading and executing a program stored in the storage. The storage is composed of a storage device such as, but not limited to, a RAM (Random Access Memory), a ROM (Read Only Memory), or a hard disk. The storage stores therein programs for controlling the various processings performed in the plating unit 2.

The programs may be recorded on a computer-readable recording medium 31, or may be installed into the storage from the recording medium 31. The computer-readable recording medium 31 may be, by way of non-limiting example, a hard disk (HD), a flexible disk (FD), a compact disk (CD), a magnet optical disk (MO), a memory card, or the like. The various programs recorded on the recording medium 31 include, for example, a program that causes the computer to control the plating apparatus 1 to perform a plating method (substrate liquid processing method).

The plating unit 2 has a carry-in out station 21 and a processing station 22 provided adjacent to the carry-in/out station 21.

The carry-in/out station 21 is equipped with a placing unit 211 and a transfer unit 212 provided adjacent to the placing unit 211. In the placing unit 211, a plurality of transfer containers (hereinafter referred to as "carriers C") each accommodating therein a plurality of substrates W horizontally is disposed. The transfer unit 212 includes a transfer mechanism 213 and a delivery unit 214. The transfer mechanism 213 includes a holding mechanism configured to hold the substrate W, and is configured to be movable in a horizontal direction and a vertical direction and pivotable around a vertical axis.

The processing station 22 includes plating devices 5. In the present exemplary embodiment, the number of the plating devices 5 belonging to the processing station 22 is two or more, but may be one. The plating devices 5 are arranged on both sides of a transfer path 221 extending in a preset direction (on both sides of the transfer path 221 in a direction perpendicular to a moving direction of a transfer mechanism 222). The transfer mechanism 222 is disposed in the transfer path 221. The transfer mechanism 222 includes a holding mechanism configured to hold the substrate W, and is configured to be movable in a horizontal direction and a vertical direction and pivotable around a vertical axis.

In the plating unit 2, the transfer mechanism 213 of the carry-in/out station 21 transfers the substrate W between the carrier C and the delivery unit 214. Specifically, the transfer mechanism 213 takes out the substrate W from the carrier C placed in the placing unit 211, and places the taken substrate W in the delivery unit 214. Also, the transfer mechanism 213 takes out the substrate W placed in the delivery unit 214 by the transfer mechanism 222 of the processing station 22, and accommodates it in the carrier C of the placing unit 211.

In the plating unit 2, the transfer mechanism 222 of the processing station 22 transfers the substrate W between the delivery unit 214 and the plating device 5 and between the plating device 5 and the delivery unit 214. Specifically, the transfer mechanism 222 takes out the substrate W placed in the delivery unit 214, and carries the taken substrate W into the plating device 5. Also, the transfer mechanism 222 takes out the substrate W from the plating device 5, and places the taken substrate W in the delivery unit 214.

Figure 2:
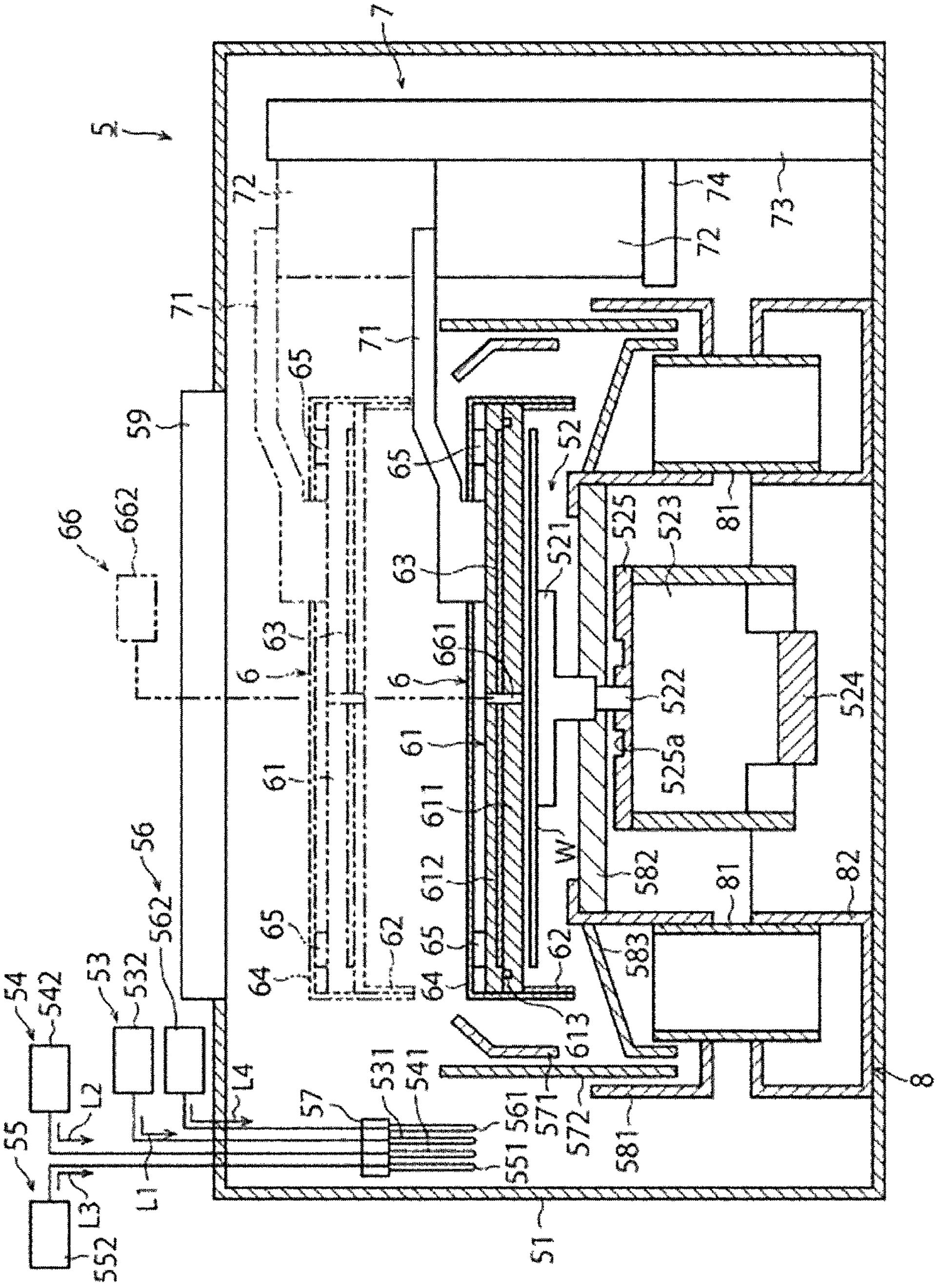
FIG. 2 is a schematic cross sectional view illustrating a configuration of a plating device.

FIG. 2 is a schematic cross sectional view illustrating a configuration of the plating device 5.

The plating device 5 is configured to perform a liquid processing including an electroless plating processing. The plating device 5 includes a chamber 51; a substrate holder 52 disposed within the chamber 51 and configured to hold the substrate W horizontally; and a plating liquid supply 53 (processing liquid supply) configured to supply a plating liquid L1 (processing liquid) onto a top surface (processing surface) of the substrate W held by the substrate holder 52. In the present exemplary embodiment, the substrate holder 52 has a chuck member 521 configured to vacuum-attract a bottom surface (rear surface) of the substrate W. This chuck member 521 is of a so-called vacuum chuck type in the example of FIG. 2, but is not limited thereto. Alternatively, the substrate holder 52 may be of a so-called mechanical chuck type, or may be configured to grip an edge portion of the substrate W with a chuck mechanism or the like.

A rotation motor 523 (rotational driving unit) is connected to the substrate holder 52 via a rotation shaft 522. When this rotation motor 523 is driven, the substrate holder 52 is rotated along with the substrate W. The rotation motor 523 is supported by a base 524 fixed to the chamber 51.

A cooling plate 525 is provided on the rotation motor 523. A cooling groove 525*a* through which a cooling liquid (for example, cooling water) flows is formed in a top surface of the cooling plate 525. This cooling groove 525*a* is formed so as to surround the rotation shaft 522, when viewed from above. The cooling liquid supplied from a cooling liquid source is introduced into the cooling groove 525*a*, flows through the cooling groove 525*a*, and then flows out of the cooling groove 525*a*. While the cooling liquid is flowing through the cooling groove 525*a*, heat is transferred between the rotation motor 523 and the cooling liquid, so that the rotation motor 523 is cooled and a temperature rise thereof is suppressed.

The plating liquid supply 53 includes a plating liquid nozzle 531 (processing liquid nozzle) configured to supply the plating liquid L1 (first electroless plating liquid) to the substrate W held by the substrate holder 52; and a plating liquid source 532 configured to supply the plating liquid L1 to the plating liquid nozzle 531. The plating liquid source 532 is configured to supply the plating liquid L1 regulated to a predetermined temperature to the plating liquid nozzle 531. The temperature of the plating liquid L1 when it is discharged from the plating liquid nozzle 531 is, for example, in the range of 55° C. to 75° C. inclusive, and, more desirably, in the range of 60° C. to 70° C. inclusive. The plating liquid nozzle 531 is held by a nozzle arm 57 and is configured to be movable.

The plating liquid L1 is a plating liquid for autocatalytic (reduction type) electroless plating. The plating liquid L1 contains, for example, metal ions such as, but not limited to, cobalt (Co) ions, nickel (Ni) ions, tungsten (W) ions, copper (Cu) ions, palladium (Pd) ions, or gold (Au) ions; and a reducing agent such as hypophosphorous acid or dimethyl amine borane. The plating liquid L1 may further contain an additive or the like. Examples of a plating film (plating metal) that can be formed from the plating liquid L1 include metals such as Co, Ni, Cu, Pd, and Au, or alloys such as CoWB, CoB, CoWP, CoWBP, NiWB, NiB, NiWP, and NiWBP.

The plating device 5 is further equipped with a cleaning liquid supply 54 configured to supply a cleaning liquid L2 to the top surface of the substrate W held by the substrate holder 52, a rinse liquid supply 55 configured to supply a rinse liquid L3 to the top surface of the substrate W; and a pretreatment liquid supply 56 configured to supply a pretreatment liquid L4 to the top surface of the substrate W.

The cleaning liquid supply 54 includes a cleaning liquid nozzle 541 configured to discharge the cleaning liquid L2 to the substrate W held by the substrate holder 52, and a cleaning liquid source 542 configured to supply the cleaning liquid L2 to the cleaning liquid nozzle 541. The cleaning liquid L2 may be, by way of non-limiting example, an organic acid such as formic acid, malic acid, succinic acid, citric acid, or malonic acid, or hydrofluoric acid (DHF) (aqueous solution of hydrogen fluoride) diluted to a concentration that does not corrode a processing target surface of the substrate W. The cleaning liquid nozzle 541 is held by the nozzle arm 57 and is configured to be movable along with the plating liquid nozzle 531.

The rinse liquid supply 55 includes a rinse liquid nozzle 551 configured to discharge the rinse liquid L3 to the substrate W held by the substrate holder 52, and a rinse liquid source 552 configured to supply the rinse liquid L3 to the rinse liquid nozzle 551. The rinse liquid nozzle 551 is held by the nozzle arm 57, and is configured to be movable along with the plating liquid nozzle 531 and the cleaning liquid nozzle 541. As an example of the rinse liquid L3, pure water or the like may be used.

The pretreatment liquid supply 56 is equipped with a pretreatment liquid nozzle 561 configured to discharge the pretreatment liquid L4 (first pretreatment liquid) to the substrate W held by the substrate holder 52, and a pretreatment liquid source 562 configured to supply the pretreatment liquid L4 to the pretreatment liquid nozzle 561. The pretreatment liquid nozzle 561 is held by the nozzle arm 57, and is configured to be movable along with the plating liquid nozzle 531, the cleaning liquid nozzle 541, and the rinse liquid nozzle 551. The pretreatment liquid source 562 is configured to supply the pretreatment liquid L4 with an adjusted temperature to the pretreatment liquid nozzle 561.

Although the composition of a liquid that can be used as the pretreatment liquid L4 is not particularly limited, the pretreatment liquid L4 of the present exemplary embodiment contains a reducing agent, a pH adjuster, and an additive (an accelerator or an inhibitor) that accelerates or inhibits an electroless plating reaction.

The reducing agent contained in the pretreatment liquid L4 reduces a surface oxide film of the substrate W, and modifies the surface of the substrate W to increase the activity of the plating reaction of the substrate W. As a result, the electroless plating reaction is actively performed immediately after the plating liquid L1 is applied to the substrate W. For this reason, the time (incubation time) taken before the plating metal is actually precipitated after the application of the plating liquid L1 can be shortened and even made close to zero 0 without limitation. Therefore, it is possible to effectively suppress "thinning of the seed layer 11 due to the corrosion of the seed layer 11 by the electroless plating liquid" that may occur immediately after the application of the plating liquid L1 to the substrate W.

In the present exemplary embodiment, the reducing agent contained in the pretreatment liquid L4 may be the same as or different from the reducing agent contained in the plating liquid L1. Further, the concentration of the reducing agent in the pretreatment liquid L4 is higher than the concentration of the reducing agent in the plating liquid L1. As a result, the surface of the substrate W can be effectively modified during the pretreatment. If the plating liquid L1 contains the high concentration of the reducing agent, the plating reaction may become unstable. If, however, the pretreatment liquid L4 is used, the stability of the plating reaction may not be reduced even if the pretreatment liquid L4 contains the high concentration of the reducing agent.

The additive (in particular, the accelerator that accelerates the electroless plating reaction or the inhibitor that inhibits the electroless plating reaction) contained in the pretreatment liquid L4 adheres to the exposed surface of the seed layer 11. Depending on the adhesion state (for example, an adhesion amount, an adhesion density, etc.) of the additive to the seed layer 11, the progress of the electroless plating reaction when the plating liquid L1 is applied to the substrate W afterwards may be controlled.

The specific composition of the additive contained in the pretreatment liquid L4 is not particularly limited, and the pretreatment liquid L4 contains the additive selected based on the plating metal to be precipitated. For example, when precipitating a copper plating by the electroless plating processing, an organic sulfur compound, an organic nitrogen compound, or a polymer compound may be typically used as the additive contained in the pretreatment liquid L4.

The pH adjuster contained in the pretreatment liquid L4 can enhance the effect of modifying the seed layer 11 by the reducing agent, and also controls the adhesion state of the additive to the seed layer 11. That is, by adjusting the pretreatment liquid L4 to a high pH (i.e., alkaline) with the pH adjuster, the effect of the reduction of the seed layer 11 by the reducing agent can be enhanced, so that the incubation time of the electroless plating reaction can be further shortened.

Moreover, the zeta potential of the additive is adjusted by the pH adjuster, and the adhesivity of the additive to the seed layer 11 is controlled. That is, the adhesion state of the additive to the seed layer 11 varies depending on the pH of the pretreatment liquid L4. Therefore, by adjusting and stabilizing the pH of the pretreatment liquid L4 to a required pH with the pH adjuster contained in the pretreatment liquid L4, the adhesion state of the additive to the seed layer 11 can be controlled.

The specific composition of the pH adjuster contained in the pretreatment liquid L4 is not particularly limited. An optimal pH of the pretreatment liquid L4 for obtaining the required adhesion state of the additive to the seed layer 11 varies depending on the type of the additive. Thus, the pH adjuster adjusts the pretreatment liquid L4 to alkaline, neutral, or acidic depending on the additive actually used. In order to adjust the pH of the pretreatment liquid L4 to alkaline, a strongly alkaline quaternary ammonium compound, for example, may be used as the pH adjuster. Meanwhile, in order to adjust the pH of the pretreatment liquid L4 to acidic, an aqueous solution of an inorganic acid, for example, may be used as the pH adjuster. When an organic sulfur compound is used as an example of the additive, the pH adjuster may adjust the pretreatment liquid L4 to acidic (e.g., a pH of 3 or less (as an example, 'pH=2')), thus enabling the plating metal to be precipitated in each recess 10 in the bottom-up manner.

Additionally, if the pretreatment liquid L4 is acidic, the seed layer 11 may be corroded by the pretreatment liquid L4. Therefore, by using the alkaline pretreatment liquid L4, the corrosion of the seed layer 11 can be avoided or reduced. Further, in addition to the reducing action of the reducing agent contained in the pretreatment liquid L4, since the alkaline pretreatment liquid L4 also reduces the surface oxide film of the seed layer 11, the surface of the seed layer 11 can be more effectively modified. In this way, from the viewpoint of suppressing the corrosion of the seed layer 11 or accelerating the modification, it is desirable that the pretreatment liquid L4 has alkaline properties (for example, a pH of '11' or higher).

A non-illustrated nozzle moving mechanism is connected to the nozzle arm 57 holding the plating liquid nozzle 531, the cleaning liquid nozzle 541, the rinse liquid nozzle 551, and the pretreatment liquid nozzle 561 described above. The nozzle moving mechanism moves the nozzle arm 57 in a horizontal direction and a vertical direction. More specifically, the nozzle arm 57 is moved by the nozzle moving mechanism between a discharge position where the processing liquid (the plating liquid L1, the cleaning liquid L2, the rinse liquid L3, or the pretreatment liquid L4) is discharged onto the substrate W and a retreat position retreated from the discharge position. The discharge position is not particularly limited as long as the processing liquid can be supplied to a certain position on the top surface of the substrate W. For example, the discharge position is set to a position where the processing liquid can be supplied to the center of the substrate W. The discharge position of the nozzle arm 57 may be set differently between the respective cases of supplying the plating liquid L1, the cleaning liquid L2, the rinse liquid L3, and the pretreatment liquid L4 onto the substrate W. The retreat position is a position within the chamber 51, far from the discharge position and not overlapping the substrate W when viewed from above. When the nozzle arm 57 is placed at the retreat position, interference between the nozzle arm 57 and a cover body 6 being moved is avoided.

A cup 571 is disposed around the substrate holder 52. The cup 571 is formed in a ring shape when viewed from above, receives the processing liquid scattered from the substrate W when the substrate W is rotated, and guides the received processing liquid to a drain duct 581. An atmosphere blocking cover 572 is provided around the cup 571 to suppress diffusion of an atmosphere around the substrate W into the chamber 51. This atmosphere blocking cover 572 is formed in a cylindrical shape extending in a vertical direction with an open top. The cover body 6 can be inserted into the atmosphere blocking cover 572 from above.

The drain duct 581 is provided below the cup 571. The drain duct 581 is formed in a ring shape when viewed from above, receives the processing liquid falling after being received by the cup 571 and the processing liquid falling directly from around the substrate W, and drains the received processing liquid. An inner cover 582 is provided on an inner peripheral side of the drain duct 581. The inner cover 582 is disposed above the cooling plate 525 to suppress diffusion of the processing liquid and the atmosphere around the substrate W. A guide member 583 is disposed above an exhaust pipe 81 to guide the processing liquid to the drain duct 581. The guide member 583 suppresses the processing liquid falling down above the exhaust pipe 81 from reaching the inside of the exhaust pipe 81, allowing the processing liquid to be received into the drain duct 581.

The substrate W held by the substrate holder 52 is covered by the cover body 6. The cover body 6 has a ceiling member 61 and a sidewall member 62 extending downwards from the ceiling member 61. The ceiling member 61 is disposed above the substrate W held by the substrate holder 52 when the cover body 6 is positioned at a first distance position and a second distance position, facing the substrate W at a relatively small distance therebetween.

The ceiling member 61 includes a first ceiling plate 611, and a second ceiling plate 612 provided on top of the first ceiling plate 611. A heater 63 (heating unit) is interposed between the first ceiling plate 611 and the second ceiling plate 612. The first ceiling plate 611 and the second ceiling plate 612 are configured to seal the heater 63 and suppress the heater 63 from coming into contact with the processing liquid such as the plating liquid L1. More specifically, a seal ring 613 is disposed around the heater 63 between the first ceiling plate 611 and the second ceiling plate 612, and the heater 63 is hermetically sealed by this seal ring 613. Desirably, the first ceiling plate 611 and the second ceiling plate 612 have corrosion resistance against the processing liquid such as the plating liquid L1, and may be formed of, for example, an aluminum alloy. Additionally, in order to increase the corrosion resistance, the first ceiling plate 611, the second ceiling plate 612, and the sidewall member 62 may be coated with Teflon (registered trademark).

A cover body moving mechanism 7 is connected to the cover body 6 via a cover body arm 71. The cover body moving mechanism 7 moves the cover body 6 in a horizontal direction and a vertical direction. More specifically, the cover body moving mechanism 7 includes a turning motor 72 configured to move the cover body 6 in the horizontal direction, and a cylinder 73 (distance adjuster) configured to move the cover body 6 in the vertical direction. The turning motor 72 is mounted on a supporting plate 74 configured to be vertically movable with respect to the cylinder 73. Instead of the cylinder 73, an actuator (not shown) including a motor and a ball screw may be used.

The turning motor 72 of the cover body moving mechanism 7 moves the cover body 6 between an upper position disposed above the substrate W held by the substrate holder 52 and a retreat position retreated from the upper position. The upper position is a position facing the substrate W held by the substrate holder 52 at a relatively large distance therebetween, and is a position that overlaps the substrate W when viewed from above. The retreat position is a position within the chamber 51 that does not overlap the substrate W when viewed from above. When the cover body 6 is located at the retreat position, interference between the cover body 6 and the nozzle arm 57 being moved is avoided. A rotational axis of the turning motor 72 extends in the vertical direction, and the cover body 6 is configured to be pivotable in the horizontal direction between the upper position and the retreat position.

The cylinder 73 of the cover body moving mechanism 7 moves the cover body 6 in the vertical direction to adjust the distance between the top surface of the substrate W and the first ceiling plate 611 of the ceiling member 61. More specifically, the cylinder 73 may locate the cover body 6 at the first distance position, the second distance position, or the aforementioned upper position (the position indicated by a dashed double-dotted line in FIG. 2).

When the cover body 6 is placed at the first distance position, the distance between the substrate W and the first ceiling plate 611 becomes a first distance which is the smallest, so that the first ceiling plate 611 is disposed closest to the substrate W. In this case, by setting the first distance to a distance at which the first ceiling plate 611 is not in contact with the liquid on the substrate W, contamination of the liquid and generation of bubbles in the liquid can be effectively suppressed.

When the cover body 6 is placed at the second distance position, the distance between the substrate W and the first ceiling plate 611 becomes a second distance larger than the first distance. As a result, the cover body 6 is placed above the first distance position.

When the cover body 6 is placed at the upper position, the distance between the substrate W and the first ceiling plate 611 becomes larger than the second distance, and the cover body 6 is positioned above the second distance position. As a result, when the cover body 6 is pivoted in the horizontal direction, interference between the cover body 6 and the surrounding structures such as the cup 571 and the atmosphere blocking cover 572 can be avoided.

When the cover body 6 is located at the above-described first distance position and the second distance position, the heater 63 is driven so that the liquid on the substrate W is heated. In other words, when the liquid on the substrate W is heated, the cylinder 73 is capable of adjusting the distance between the substrate W and the first ceiling plate 611 into the first distance or the second distance.

The sidewall member 62 of the cover body 6 extends downwards from a peripheral portion of the first ceiling plate 611 of the ceiling member 61, and when the liquid on the substrate W is heated (when the cover body 6 is located at the first distance position or the second distance position), the sidewall member 62 is disposed around the substrate W. When the cover body 6 is located at the first distance position, a lower end of the sidewall member 62 is located lower than the substrate W. In this case, the distance between the lower end of the sidewall member 62 and the bottom surface of the substrate W in the vertical direction may be set to be in the range of, e.g., 10 mm to 30 mm. Even when the cover body 6 is placed at the second distance position, the lower end of the sidewall member 62 is still positioned lower than the substrate W. In this case, the distance between the lower end of the sidewall member 62 and the bottom surface of the substrate W may be set to be in the range of, e.g., 4 mm to 5 mm.

The heater 63 heats the processing liquid (for example, the plating liquid 1) on the substrate W when the cover body 6 is positioned at the first distance position or the second distance position.

An inert gas (for example, a nitrogen ($N_2$) gas) is supplied to the inside of the cover body 6 by an inert gas supply 66. The inert gas supply 66 has a gas nozzle 661 configured to discharge the inert gas to the inside of the cover body 6, and an inert gas source 662 configured to supply the inert gas to the gas nozzle 661. The gas nozzle 661 is provided at the ceiling member 61 of the cover body 6, and discharges the inert gas toward the substrate W in the state that the cover body 6 covers the substrate W.

The ceiling member 61 and the sidewall member 62 of the cover body 6 are covered with a cover body cover 64. The cover body cover 64 is disposed on the second ceiling plate 612 of the cover body 6 with a plurality of supporting members 65 therebetween. That is, the second ceiling plate 612 is provided with the plurality of supporting members 65 protruding upwards from a top surface of the second ceiling plate 612, and the cover body cover 64 is disposed on the supporting members 65. The cover body cover 64 is configured to be movable in the horizontal direction and the vertical direction. Further, it is desirable that the cover body cover 64 has heat insulation property higher than those of the ceiling member 61 and the sidewall member 62 in order to suppress heat within the cover body 6 from escaping to the vicinity. For example, it is desirable that the cover body cover 64 is made of a resin material, and it is more desirable that the resin material has heat resistance.

Above the chamber 51, a fan filter unit 59 (gas supply device) is configured to supply clean air (gas) to the vicinity of the cover body 6. The fan filter unit 59 supplies the air into the chamber 51 (in particular, into the atmosphere blocking cover 572), and the supplied air flows toward the exhaust pipe 81. A downflow of the air flowing downwards is formed around the cover body 6, and a gas vaporized from the processing liquid such as the plating liquid L1 flows toward the exhaust pipe 81 by being carried by this downflow. Accordingly, the gas vaporized from the processing liquid is suppressed from rising and diffusing into the chamber 51.

The gas supplied from the above-described fan filter unit 59 is exhausted through an exhaust mechanism 8. The exhaust mechanism 8 has two exhaust pipes 81 provided below the cup 571, and an exhaust duct 82 provided below the drain duct 581. The two exhaust pipes 81 penetrate a bottom of the drain duct 581 to respectively communicate with the exhaust duct 82. The exhaust duct 82 is formed in a substantially semicircular ring shape when viewed from above. In the present exemplary embodiment, the single exhaust duct 82 is provided under the drain duct 581, and the two exhaust pipes 81 communicate with this exhaust duct 82.

Now, an example of a plating method performed by the plating apparatus 1 will be described.

FIG. 3 to FIG. 6 are enlarged cross sectional views illustrating an example of the substrate W (particularly, the recess 10) for describing an example of the plating method. To ease understanding, illustration of the plating liquid L1 and the pretreatment liquid L4 is omitted in FIG. 4 to FIG. 6.

The plating method performed by the plating apparatus 1 is carried out as the plating device 5 is appropriately controlled by the controller 3. While the following processing is being performed, the clean air is supplied into the chamber 51 from the fan filter unit 59 and flows toward the exhaust pipe 81. Also, the cooling liquid passes through the cooling groove 525*a* of the cooling plate 525 provided on the rotation motor 523, so that the rotation motor 523 is cooled.

[Substrate Holding Process]

First, the substrate W is prepared. That is, the substrate W as a processing target is carried into the plating device 5 and held by the substrate holder 52.

Figure 3:
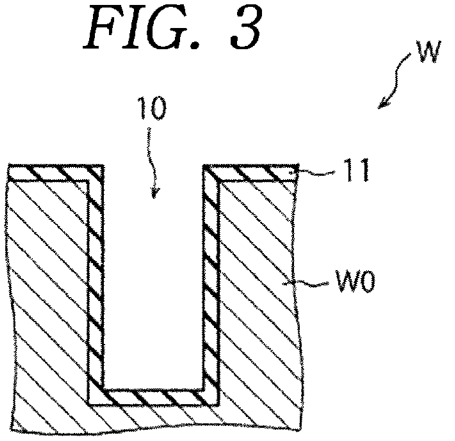
FIG. 3 is an enlarged cross sectional view illustrating an example of a substrate (particularly, a recess) for describing an example of a plating method.

The top surface (that is, a processing surface) of the substrate W used in the present exemplary embodiment has a multiple number of recesses 10 (see FIG. 3). The recess 10 is filled with a plating metal (see a reference numeral '13' in FIG. 5 and FIG. 6) that serves as a wiring through an electroless plating processing to be described later.

As depicted in FIG. 3, the substrate W has a substrate main body W0 and the seed layer 11 stacked on top of the substrate main body W0, and the top surface of the substrate W is formed by the seed layer 11. In the present exemplary embodiment, the seed layer 11 is provided over the entire top surface of the substrate W, and the entire surface of each recess 10 is formed of the seed layer 11. The seed layer 11 acts as a catalyst for the electroless plating reaction to accelerate the precipitation of the plating metal.

Although the specific composition of the seed layer 11 is not particularly limited, the seed layer 11 may be composed of a metal selected based on the plating metal to be precipitated during the electroless plating processing. For example, when copper (Cu) is precipitated as the plating metal, the seed layer 11 may be made of a cobalt-based material.

[Substrate Cleaning Process]

Next, a cleaning processing is performed on the top surface of the substrate W held by the substrate holder 52. Specifically, the rotation motor 523 is driven to rotate the substrate W. In the meantime, the nozzle arm 57 located at the retreat position is moved to the discharge position. Then, the cleaning liquid L2 is supplied to the substrate W being rotated from the cleaning liquid nozzle 541, so that the surface of the substrate W is cleaned. The cleaning liquid L2 washes away the deposit or the like from the substrate W and is drained through the drain duct 581.

[Substrate Rinsing Process]

Then, a rinsing processing is performed on the top surface of the substrate W held by the substrate holder 52. Specifically, the rinse liquid L3 is supplied to the substrate W being rotated from the rinse liquid nozzle 551. The rinse liquid L3 washes away the cleaning liquid L2 remaining on the substrate W, and is then drained through the drain duct 581.

[Pretreatment Process]

Subsequently, the pretreatment liquid L4 is applied to the top surface of the substrate W held by the substrate holder 52, and this pretreatment liquid L4 comes into contact with the seed layer 11. Specifically, the pretreatment liquid L4 is supplied from the pretreatment liquid nozzle 561 to the substrate W being rotated in a room temperature environment (for example, in an environment of about 1° C. to 30° C.). After a preset amount of the pretreatment liquid L4 is discharged from the pretreatment liquid nozzle 561, the supply of the plating liquid L1 from the plating liquid source 532 to the plating liquid nozzle 531 is stopped, so that the supply of the plating liquid L1 to the substrate W is stopped.

The pretreatment liquid L4 applied to the substrate W from the pretreatment liquid nozzle 561 is spread over the entire top surface of the substrate W, forming a liquid accumulation layer (that is, a puddle) on the top surface of the substrate W. As a result, the entire top surface of the substrate W is covered with the pretreatment liquid L4, and each recess 10 is filled with the pretreatment liquid L4. In the present exemplary embodiment, the state in which the substrate W is covered with the pretreatment liquid L4 (that is, the state in which the pretreatment liquid L4 is in contact with the seed layer 11 of the recess 10) is maintained in the room temperature environment for a predetermined time (for example, about 30 seconds or more).

As a result, the surface of the seed layer 11 is reduced and modified by the reducing agent contained in the pretreatment liquid L4, and the additive 12 contained in the pretreatment liquid L4 adheres to the surface of the seed layer 11.

Figure 4:
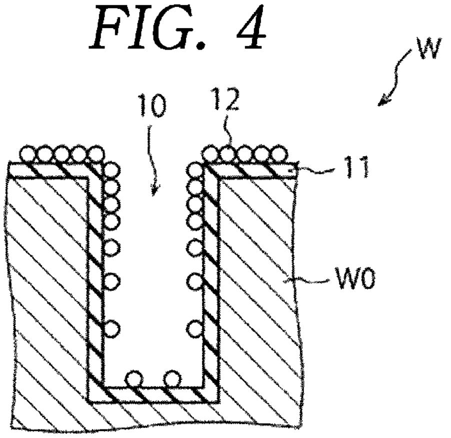
FIG. 4 is an enlarged cross sectional view illustrating the example of the substrate (particularly, the recess) for describing the example of the plating method.

The additive 12 illustrated as an example in FIG. 4 is the inhibitor that inhibits the electroless plating reaction. When the inhibitor that inhibits the electroless plating reaction is used as the additive 12, the inhibitor adheres at a higher density to a portion of the seed layer 11 forming an upper side surface of the recess 10 than to portions of the seed layer 11 forming a bottom surface and a lower side surface of the recess 10. Meanwhile, when an accelerator that accelerates the electroless plating reaction is used as the additive 12, the accelerator adheres at a higher density to the portions of the seed layer 11 forming the bottom surface and the lower side surface of the recess 10 than to the portion of the seed layer 11 forming the upper side surface of the recess 10. According to these aspects, a precipitation rate of the plating metal in a lower region of the recess 10 is faster than a precipitation rate of the plating metal in an upper region of the recess 10. Therefore, the plating metal can be controlled to be precipitated in the bottom-up manner.

In FIG. 4 showing the pretreatment process, illustration of the pretreatment liquid L4 is omitted. Actually, however, the entire seed layer 11 shown in FIG. 4 is covered with the pretreatment liquid L4, and each recess 10 is filled with the pretreatment liquid L4. Further, although the additive 12 is clearly shown in FIG. 4, the actual additive 12 is attached to the seed layer 11 at a molecular level, so it is difficult to identify the additive 12 directly with eyes.

A rotation speed of the substrate W when the pretreatment liquid L4 is supplied to the substrate W is set to be lower than a rotation speed in the rinsing processing described above, e.g., 50 rpm to 150 rpm. Accordingly, it is possible to make the film thickness of the puddle of the pretreatment liquid L4 uniform while accelerating the diffusion of the pretreatment liquid L4 on the substrate W. Some of the pretreatment liquid L4 applied to the substrate W flows out from the top surface of the substrate W, and is drained through the drain duct 581. Further, when the pretreatment liquid L4 is supplied to the substrate W, the rotation of the substrate W may be stopped. In this case, a large amount of the pretreatment liquid L4 can be maintained on the substrate W, so that the film thickness of the puddle of the pretreatment liquid L4 can be increased.

Furthermore, the pretreatment liquid L4 on the substrate W may be heated by the heater 63. That is, although the pretreatment process is performed in the room temperature environment in the above-described exemplary embodiment, the pretreatment process may be performed in a high temperature environment in which the substrate W and/or the pretreatment liquid L4 is actively heated. In this case, the pretreatment of the substrate W can be promoted. Since the heating of the pretreatment liquid L4 can be performed through the same process as heating of the plating liquid L1 to be described later, detailed description of the heating of the pretreatment liquid L4 will be omitted here.

As described above, in this process, the pretreatment liquid L4 is applied to the substrate W prior to the application of the plating liquid L1, accelerating the electroless plating processing using the plating liquid L1 to be described later. Accordingly, the recess 10 of the substrate W can be appropriately filled with the plating metal 13.

[Electroless Plating Process]

Figure 5:
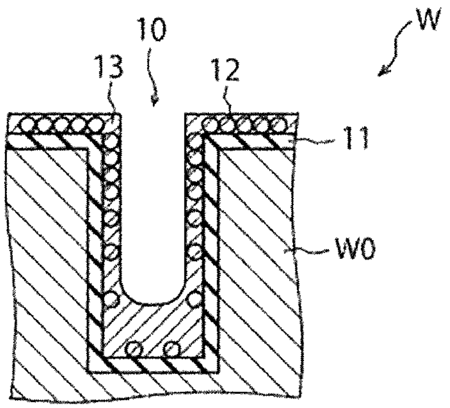
FIG. 5 is an enlarged cross sectional view illustrating the example of the substrate (particularly, the recess) for describing the example of the plating method.
Figure 6:
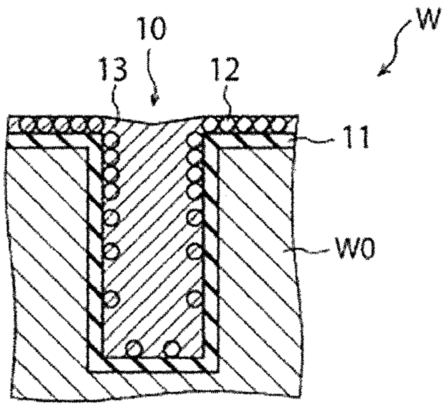
FIG. 6 is an enlarged cross sectional view illustrating the example of the substrate (particularly, the recess) for describing the example of the plating method.

After bringing the pretreatment liquid L4 into contact with the seed layer 11, the plating liquid L1 is supplied to the top surface (including the recess 10) of the substrate W, so that the plating metal 13 is precipitated on the top surface (including the recess 10) of the substrate W (see FIG. 5 and FIG. 6).

To be specific, the plating liquid L1 is supplied to the substrate W being rotated from the plating liquid nozzle 531. The plating liquid L1 is spread over the entire top surface of the substrate W, forming a liquid accumulation (puddle) on the top surface of the substrate W. As a result, the entire top surface of the substrate W is covered with the plating liquid L1, and each recess 10 is filled with the plating liquid L1.

In FIG. 5 and FIG. 6 illustrating the electroless plating process, illustration of the plating liquid L1 is omitted. Actually, however, the entire seed layer 11 shown in FIG. 5 and FIG. 6 is covered with the plating liquid L1, and the recess 10 shown in FIG. 5 and FIG. 6 is filled with the plating liquid L1.

As a result, in the plating liquid L1 on the substrate W, the seed layer 11 is used as the catalyst, the plating metal 13 is gradually precipitated on the seed layer 11 by the electroless plating reaction, and, finally, the entire recess 10 is filled with the plating metal 13. As stated above, since the plating liquid L1 is applied to the seed layer 11 whose properties have been modified by the pretreatment liquid L4, the plating metal 13 is filled in each recess 10 in a required state. Therefore, it is possible to effectively suppress the formation of voids or seams in the plating metal 13 (see FIG. 6).

That is, since the surface of the seed layer 11 is modified by the reducing agent contained in the pretreatment liquid L4, the plating metal 13 can be precipitated on the seed layer 11 immediately after the plating liquid L1 is applied to the seed layer 11. Therefore, the seed layer 11 can be suppressed from being thinned due to the corrosion of the seed layer 11 by the plating liquid L1. Additionally, the additive 12 is attached on the surface of the seed layer 11 to accelerate the precipitation of the plating metal 13 in the bottom-up manner. Thus, the plating metal 13 is gradually deposited upwards from the bottom in the recess 10 (see FIG. 5), so that the formation of the voids or seams may be suppressed.

The electroless plating process according to the present exemplary embodiment performed by using the above-described plating device 5 (see FIG. 2) includes a plating liquid accumulating process and a plating liquid heating process.

<Plating Liquid Accumulating Process>

The plating liquid L1 is supplied and accumulated on the substrate W pretreated by the pretreatment liquid L4. In this case, the rotation speed of the substrate W may be set to be lower than the rotation speed in the rinsing processing, e.g., 50 rpm to 150 rpm. As a result, it is possible to make the film thickness of the puddle of the plating liquid L1 uniform while accelerating the diffusion of the plating liquid L1 on the substrate W. Some of the plating liquid L1 applied to the substrate W flows out from the top surface of the substrate W and is drained through the drain duct 581. Further, when the plating liquid L1 is supplied to the substrate W, the rotation of the substrate W may be stopped. In this case, a large amount of the plating liquid L1 can be maintained on the substrate W, so that the film thickness of the puddle of the plating liquid L1 can be increased.

Thereafter, the nozzle arm 57 placed at the discharge position is moved to the retreat position.

<Plating Liquid Heating Process>

Subsequently, the plating liquid L1 accumulated on the substrate W is heated. This plating liquid heating process includes a process of covering the substrate W with the cover body 6, a process of supplying the inert gas, a first heating process of heating the plating liquid L1 in the state that the distance between the substrate W and the first ceiling plate 611 is set to the first distance, and a second heating process of heating the plating liquid L1 in the state that the distance between the substrate W and the first ceiling plate 611 is set to the second distance. In the plating liquid heating process, the substrate W may be rotated at a rotation speed equal to or different from the rotation speed in the plating liquid accumulating process, or the rotation thereof may be stopped.

In the plating liquid heating process of the present exemplary embodiment, the substrate W is covered by the cover body 6. That is, the turning motor 72 of the cover body moving mechanism 7 is driven, allowing the cover body 6 located at the retreat position to be pivoted in the horizontal direction and placed at the upper position. Then, the cylinder 73 of the cover body moving mechanism 7 is driven, allowing the cover body 6 located at the upper position to be lowered and placed at the first distance position. Accordingly, as the distance between the substrate W and the first ceiling plate 611*f* the cover body 6 becomes the first distance, the sidewall member 62 of the cover body 6 is disposed around the substrate W, and the lower end of the sidewall member 62 of the cover body 6 is located at the position lower than the bottom surface of the substrate W. As a result, the substrate W is covered by the cover body 6.

In the state that the substrate W is covered by the cover body 6, the gas nozzle 661 provided at the ceiling member 61 of the cover body 6 discharges the inert gas to the inside of the cover body 6, turning the vicinity of the substrate W into a low-oxygen atmosphere. After the inert gas is discharged for a preset period of time, the discharge of the inert gas is stopped.

Then, the heater 63 is driven to heat the plating liquid L1 accumulated on the substrate W. That is, the heat emitted from the heater 63 is transferred to the plating liquid L1 on the substrate W, so the temperature of the plating liquid L1 increases. The heating of the plating liquid L1 is performed so that the temperature of the plating liquid L1 rises to a predetermined temperature. When the temperature of the plating liquid L1 rises to a temperature at which the plating metal 13 can be precipitated, the plating metal 13 is precipitated on the top surface of the substrate W.

Thereafter, the cylinder 73 of the cover body moving mechanism 7 is driven, allowing the cover body 6 to be raised from the first distance position and placed at the second distance position. Accordingly, the distance between the substrate W and the first ceiling plate 611 of the cover body 6 becomes the second distance. In this case, the sidewall member 62 of the cover body 6 is disposed around the substrate W, and the lower end of the sidewall member 62 is located at the position lower than the bottom surface of the substrate W. Thus, the substrate W is still covered by the cover body 6.

Then, the heater 63 is driven to heat the plating liquid L1 accumulated on the substrate W. At this time, the temperature of the plating liquid L1 does not substantially increase but the temperature of the plating liquid L1 is maintained so that the plating liquid L1 is kept warm. In this way, the second distance position is set to a position where the plating liquid L1 is kept warm by the heat emitted from the heater 63. Thus, an overrise of the temperature of the plating liquid L1 is suppressed, so that deterioration of the plating liquid L1 may be suppressed.

The heating of the plating liquid L1 performed in this way is carried out to obtain a required thickness of the plating metal 13.

Thereafter, the cover body moving mechanism 7 is driven, allowing the cover body 6 to be placed at the retreat position. That is, the cylinder 73 of the cover body moving mechanism 7 is driven, so the cover body 6 located at the second distance position is raised to be placed at the upper position. Then, the turning motor 72 of the cover body moving mechanism 7 is driven, allowing the cover body 6 located at the upper position to be pivoted in the horizontal direction and placed at the retreat position.

In this way, the plating liquid heating process of the substrate W is completed.

[Substrate Rinsing Process]

After the recess of the substrate W is filled with the plating metal 13, a rinsing processing is performed on the substrate W held by the substrate holder 52. Specifically, the rinse liquid L3 is supplied to the substrate W being rotated from the rinse liquid nozzle 551. The rinse liquid L3 washes away the plating liquid L1 remaining on the substrate W, and is then drained through the drain duct 581.

In this substrate rinsing process, the rotation speed of the substrate W is increased from the rotation speed in the plating processing. For example, the substrate W is rotated at the same rotation speed as in the substrate rinsing process before the plating process. Next, the rinse liquid nozzle 551 located at the retreat position is moved to the discharge position. Then, the rinse liquid L3 is supplied to the substrate W being rotated from the rinse liquid nozzle 551, so that the surface of the substrate W is cleaned. As a result, the plating liquid L1 remaining on the substrate W is washed away.

[Substrate Drying Process]

Subsequently, the substrate W after being subjected to the rinsing processing is dried. For example, the rotation speed of the substrate W is increased higher than the rotation speed in the substrate rinsing process to rotate the substrate W at a high speed. As a result, the rinse liquid L3 remaining on the substrate W is shaken off and removed, and the substrate W having the plating film formed thereon is obtained. In this case, the drying of the substrate W may be accelerated by discharging an inert gas such as nitrogen gas to the substrate W.

[Substrate Taking-Out Process]

Thereafter, the substrate W is taken out from the substrate holder 52 and carried out from the plating device 5.

In this way, the series of processes of the plating method of the substrate W using the plating apparatus 1 is ended.

[First Observation Result]

Figure 7:
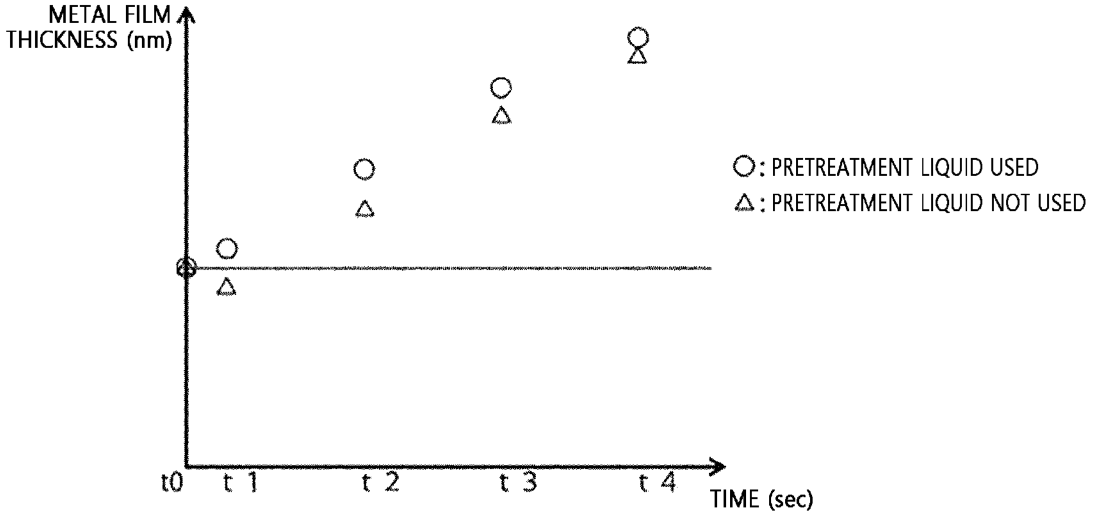
FIG. 7 is a diagram illustrating an example of a relationship between time (horizontal axis) in an electroless plating processing and a thickness (vertical axis) of a metal film (including a seed layer and a plating metal) on a surface of a recess of a substrate.

FIG. 7 is a diagram showing an example relationship between time (horizontal axis) in the electroless plating processing and thickness (vertical axis) of the metal film (including the seed layer 11 and the plating metal 13) on the surface of the recess 10 of the substrate W.

The inventors of the present application actually have deposited the plating metal 13 (specifically, copper) on the substrate W provided with the seed layer 11 by using the above-described plating device 5, and have measured the thickness of the metal film including the seed layer 11 and the plating metal 13 overtime. To be specific, FIG. 7 shows a case where the plating metal 13 is deposited on the substrate W based on the above-described plating method including the pretreatment with the pretreatment liquid L4, and a case where the plating metal 13 is deposited on the substrate W based on the above-described plating method without including the pretreatment. In FIG. 7, results obtained by the above-described plating method including the pretreatment with the pretreatment liquid L4 are plotted with circle marks, and results obtained by the above-described plating method not including the pretreatment are plotted with triangle marks. In FIG. 7, the origin of the horizontal axis (see 't0') represents a starting point of the application of the plating liquid L1 to the substrate W, and the thickness of the metal film at t0 is equivalent to the film thickness of the seed layer 11.

When the pretreatment is not performed (as plotted with the triangle marks in FIG. 7), the thickness of the metal film (specifically, the seed layer 11) decreases immediately after the application of the plating liquid L1 to the substrate W is started (see 't0' to 't1' in FIG. 7). This is due to the corrosion of the seed layer 11 by the plating liquid L1.

Meanwhile, when the pretreatment is performed (as plotted with the circle marks in FIG. 7), the thickness of the metal film increases immediately after the application of the plating liquid L1 to the substrate W is started (see 't0' to 't1' in FIG. 7). This is because the plating metal 13 is deposited on the seed layer 11 immediately after the application of the plating liquid L1 is begun.

As can be seen from the results shown in FIG. 7, the incubation time for the precipitation of the plating metal 13 can be shortened by performing the pretreatment using the pretreatment liquid L4.

The inventors of the present invention have observed a plating state at the bottom of the recess 10 of the substrate W immediately after the start of the application of the plating liquid L1 (specifically, 5 seconds after the start of the application of the plating liquid L1) by a micrograph. According to the micrograph, it is found out that microscopic lumps of the plating metal 13 (i.e., plating metal nuclei) appear at a higher density when the pretreatment is performed, as compared to the case where the pretreatment is not performed.

[Second Observation Result]

The inventors of the present application have actually deposited the plating metal 13 (specifically, copper) on the substrate W provided with the seed layer 11 by using the above-described plating device 5, while changing the components contained in the pretreatment liquid L4, and have observed a deposition state of the plating metal 13 through micrographs. To elaborate, the pretreatments are respectively performed by using the pretreatment liquid L4 containing the reducing agent and the pH adjuster but not containing the above-described additive, the pretreatment liquid L4 containing the additive (accelerator) and the pH adjuster but not containing the reducing agent, and the pretreatment liquid L4 containing all of the reducing agent, the additive (accelerator), and the pH adjuster.

The plating metal 13 is deposited on the substrate W by using the above-described plating method under the same conditions except for the components contained in the pretreatment liquid L4.

As a result, when the pretreatment is performed by using the pretreatment liquid L4 containing the reducing agent and the pH adjuster but not containing the aforementioned additive, the plating metal 13 is precipitated immediately after the start of the application of the plating liquid L1, which indicates that the acceleration of the electroless plating reaction by the pretreatment liquid L4 has occurred. However, the plating metal 13 is found to be deposited and grown almost uniformly over the entire surface of the seed layer 11, and in the recess 10, depositional growth (conformal growth) of the plating metal 13 conforming to the surface shape of the recess 10 is observed. Thus, it cannot be said that the precipitation of the plating metal 13 in the recess 10 is sufficiently controlled in the bottom-up manner.

Further, when the pretreatment is performed by using the pretreatment liquid L4 containing the above-described additive and the pH adjuster but not containing the reducing agent, the plating metal 13 is precipitated immediately after the start of the application of the plating liquid L1, which indicates that the acceleration of the electroless plating reaction by the pretreatment liquid L4 has occurred. However, the plating metal 13 is found to be deposited and grown almost uniformly over the entire surface of the seed layer 11, and the conformal growth of the plating metal 13 is observed in the recess 10 as well. This is because, although the precipitation of the plating metal 13 is accelerated by the additive contained in the pretreatment liquid L4, the precipitation of the plating metal 13 in the recess 10 cannot be sufficiently controlled in the bottom-up manner.

Meanwhile, when the pretreatment is performed by using the pretreatment liquid L4 containing all of the reducing agent, the additive, and the pH adjuster, it is found out that the plating metal 13 is precipitated immediately after the start of the application of the plating liquid L1 and the plating metal 13 is deposited in the bottom-up manner in the recess 10.

[Third Observation Result]

The inventor of the present application has actually investigated a deposition state of the plating metal 13 through micrographs for both of a case where no pretreatment is performed and a case where the pretreatment is performed (while varying the pH value of the pretreatment liquid L4) by using the above-described plating device 5. In particular, for the case where the pretreatment is performed, a case where the pretreatment liquid L4 contains the pH adjuster that adjusts the pretreatment liquid L4 to alkaline and a case where the pretreatment liquid L4 contains the pH adjuster that adjusts the pretreatment liquid L4 to acid are respectively conducted.

Additionally, as the additive contained in the pretreatment liquid L4, the accelerator that accelerates the electroless plating reaction is used. Particularly, when the pretreatment liquid L4 is acidic, one that is easily attached to the seed layer 11 (specifically, the recess 10) in a required state (that is, a state in which the bottom-up deposition of the plating metal 13 is accelerated) is used as the accelerator.

The plating metal 13 is deposited on the substrate W according to the above-described plating method under the same conditions, except for the pretreatment and the pH of the pretreatment liquid L4.

As a result, it is confirmed that the plating metal 13 is efficiently deposited on the seed layer 11 of the substrate W when the pretreatment is performed (including the case where the pretreatment liquid L4 is acidic and the case where the pretreatment liquid L4 is alkaline), as compared to the case where no pretreatment is performed.

When the alkaline pretreatment liquid L4 is used, it is confirmed that the plating metal 13 is deposited and grown almost uniformly over the entire surface of the seed layer 11, and the precipitation of the plating metal 13 in the recess 10 is not sufficiently controlled to be carried out in the bottom-up manner.

Meanwhile, when the acidic pretreatment liquid L4 is used, it is confirmed that the plating metal 13 is deposited and grown over the entire surface of the seed layer 11, and the precipitation of the plating metal 13 in the recess 10 is sufficiently controlled to be carried out in the bottom-up manner.

As explained above, by using the pretreatment liquid L4 containing the reducing agent, the additive, and the pH adjuster, the electroless plating reaction in the substrate W can be activated, the incubation period for the precipitation of the plating metal 13 can be shortened, and the bottom-up deposition of the plating metal 13 in the recess 10 can be accelerated. As a consequence, it is possible to fill the recess 10 of the substrate W with the plating metal 13 appropriately by the electroless plating processing, while suppressing the formation of voids or seams.

First Modification Example

In the present modification example, parts identical or corresponding to those of the above-described exemplary embodiment will be assigned the same reference numerals, and detailed description thereof will be omitted.

FIG. 8 to FIG. 12 are enlarged cross sectional views of an example of the substrate W (particularly, the recess 10) for describing a plating method according to a first modification example. For the sake of easy understanding, illustration of the plating liquid and the pretreatment liquid is omitted in FIG. 8 to FIG. 12.

In the plating method according to the present modification example, a process of applying a preceding pretreatment liquid (second pretreatment liquid) and a preceding electroless plating liquid (second electroless plating liquid) to the substrate W are performed prior to the application of the pretreatment liquid L4 (first pretreatment liquid) and the plating liquid L1 (first electroless plating liquid). Accordingly, the process of depositing the plating metal 13 on the substrate W is divided into multiple stages (two stages).

The same as in the above-described exemplary embodiment, the substrate W as a processing target is carried into the plating device 5 to be held by the substrate holder 52 (substrate holding process), cleaned by the cleaning liquid L2 (substrate cleaning process), and washed away by the rinse liquid L3 (substrate rinsing process)

[Preceding Pretreatment Process]

Thereafter, a preceding pretreatment liquid (second pretreatment liquid) is applied to the top surface of the substrate W held by the substrate holder 52, and this preceding pretreatment liquid comes into contact with the seed layer 11. Basically, this preceding pretreatment process can be carried out under the same conditions as in the 'pretreatment process' of the above-described exemplary embodiment.

The preceding pretreatment liquid contains a reducing agent and a pH adjuster. The preceding pretreatment liquid is adjusted to a required pH (for example, alkaline) by the pH adjuster. The reducing agent contained in the preceding pretreatment liquid reduces a surface oxide film of the substrate W and modifies the surface of the substrate W to increase the activity of the plating reaction of the substrate W. In the present modification example, the concentration of the reducing agent is different between the preceding pretreatment liquid and the pretreatment liquid L4, and the preceding pretreatment liquid contains a reducing agent having a higher concentration than that of the pretreatment liquid L4.

The preceding pretreatment liquid of the present modification example does not contain an additive that accelerates or inhibits an electroless plating reaction, but may contain such an additive. In this case, the electroless plating reaction by the preceding electroless plating liquid can be controlled by using the additive contained in the preceding pretreatment liquid.

Figure 8:
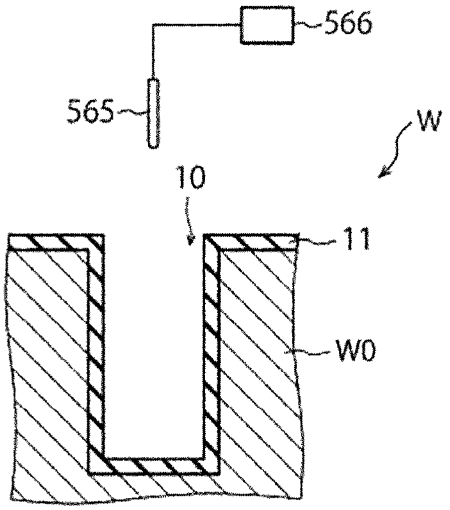
FIG. 8 is an enlarged cross sectional view illustrating an example substrate (particularly, a recess) for describing a plating method according to a first modification example.

In the example shown in FIG. 8, the preceding pretreatment liquid supplied from a preceding pretreatment liquid source 566 to a preceding pretreatment liquid nozzle 565 is discharged from the preceding pretreatment liquid nozzle 565 toward the substrate W. The preceding pretreatment liquid nozzle 565 is supported by the nozzle arm 57 (see FIG. 2), and is configured to be moved along with the nozzle arm 57. Additionally, the preceding pretreatment liquid nozzle 565 and the aforementioned pretreatment liquid nozzle 561 (see FIG. 2) may be implemented by a common nozzle. Also, the preceding pretreatment liquid source 566 and the pretreatment liquid source 562 (see FIG. 2) may be implemented by a common source.

[Preceding Electroless Plating Process]

Figure 9:
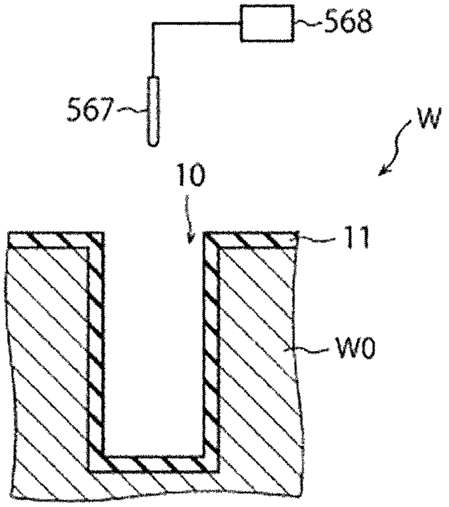
FIG. 9 is an enlarged cross sectional view illustrating the example substrate (particularly, the recess) for describing the plating method according to the first modification example.
Figure 10:
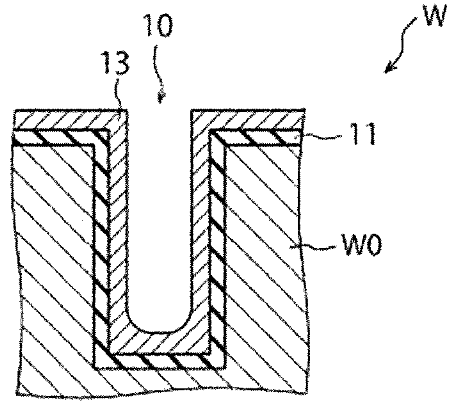
FIG. 10 is an enlarged cross sectional view illustrating the example substrate (particularly, the recess) for describing the plating method according to the first modification example.
Figure 11:
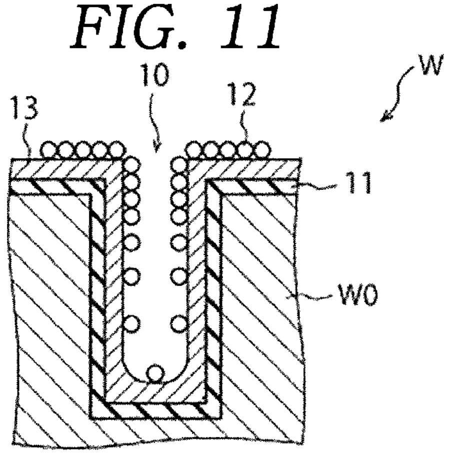
FIG. 11 is an enlarged cross sectional view illustrating the example substrate (particularly, the recess) for describing the plating method according to the first modification example.
Figure 12:
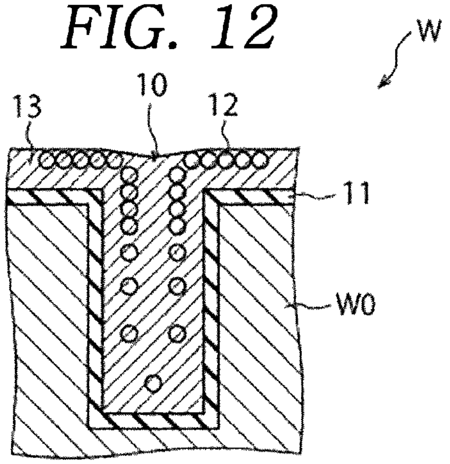
FIG. 12 is an enlarged cross sectional view illustrating the example substrate (particularly, the recess) for describing the plating method according to the first modification example.

After bringing the preceding pretreatment liquid into contact with the seed layer 11, the preceding electroless plating liquid is supplied to the top surface (including the recess 10) of the substrate W, and the plating metal 13 is precipitated on the top surface (including the recess 10) of the substrate W (see FIG. 9 and FIG. 10).

The preceding electroless plating liquid is applied on the seed layer 11 modified by the preceding pretreatment liquid. For this reason, deposition of the plating metal 13 on the seed layer 11 begins immediately after the preceding electroless plating liquid is applied to the seed layer 11. Accordingly, the overall thickness of the metal film including the seed layer 11 and the plating metal 13 can be increased while suppressing the corrosion of the seed layer 11 due to the preceding electroless plating liquid (see FIG. 10).

In this process, it is not necessarily required to deposit the plating metal 13 in recess 10 in the bottom-up manner. Therefore, as shown in FIG. 10, the depositional growth of the plating metal 13 precipitated from the preceding electroless plating liquid in the recess 10 is conformal growth following the surface shape of the recess 10. However, in this process as well, the plating metal 13 precipitated from the preceding electroless plating liquid may be deposited in the recess 10 in the bottom-up manner. In this case, by adding the additive that accelerates or inhibits the electroless plating reaction to the above-described preceding pretreatment liquid, it is possible to control the precipitation of the plating metal 13 in the recess 10 in the bottom-up manner.

This process can be basically carried out under the same conditions as the 'electroless plating process' of the above-described exemplary embodiment. Further, in the present modification example, the preceding electroless plating liquid has the same composition as the plating liquid L1 of the above-described exemplary embodiment, and the plating metal 13 having the same composition as the plating metal 13 precipitated from the plating liquid L1 is precipitated from the preceding electroless plating liquid.

In the example shown in FIG. 9, the preceding electroless plating liquid supplied from the preceding plating liquid source 568 to the preceding plating liquid nozzle 567 is discharged from the preceding plating liquid nozzle 567 toward the substrate W. The preceding plating liquid nozzle 567 is supported by the nozzle arm 57 (see FIG. 2), and is configured to be movable along with the nozzle arm 57. Additionally, the preceding plating liquid nozzle 567 and the above-described plating liquid nozzle 531 (see FIG. 2) may be implemented by a common nozzle. Furthermore, the preceding plating liquid source 568 and the plating liquid source 532 (FIG. 2) may be implemented by a common source.

Afterwards, as in the pretreatment process of the above-described exemplary embodiment, the pretreatment liquid L4 is applied to the substrate W, and the substrate W is subjected to a pretreatment. In this modification example, the pretreatment liquid L4 comes into contact with the layer of the plating metal 13 precipitated from the preceding electroless plating liquid. As a result, the exposed surface of the layer of the plating metal 13 is modified by the reducing agent, and the additive 12 adheres to the layer of the plating metal 13 (see FIG. 11).

Thereafter, as in the electroless plating process of the above-described exemplary embodiment, the plating liquid L1 is applied to the substrate W, and the substrate W is subjected to an electroless plating processing. In the present modification example, the plating liquid L1 comes into contact with the layer of the plating metal 13 precipitated from the preceding electroless plating liquid, and the plating metal 13 is gradually precipitated by an electroless plating reaction by using the layer of the plating metal 13 as a catalyst. As a result, the entire recess 10 is finally filled with the plating metal 13, and the top surface of the substrate W is covered with the plating metal 13 (see FIG. 12).

As described above, in the present modification example, the layer of the plating metal 13 precipitated from the preceding electroless plating liquid substantially functions as a seed layer, and the plating metal 13 precipitated from the pretreatment liquid L4 is deposited on the layer of the plating metal 13. For this reason, the electroless plating process in the present modification example can be performed under the conditions suitable for precipitating the plating metal 13 on the layer of the plating metal 13.

Thereafter, a substrate rinsing process, a substrate drying process, and a substrate taking-out process are performed, the same as in the above-described exemplary embodiment.

As described above, according to the present modification example, prior to brining the pretreatment liquid L4 into contact with the seed layer 11, the preceding electroless plating liquid is supplied to the recess 10 of the substrate W, so that the plating metal 13 is precipitated in the recess 10.

Accordingly, the process of precipitating the plating metal 13 on the substrate W is divided into the preceding electroless plating process and the electroless plating process. Therefore, the preceding electroless plating process can be performed to suit the conditions required for the initial stage of the electroless plating reaction, and the electroless plating process can be performed to suit the conditions required for middle and later stages of the electroless plating reaction. As a result, the electroless plating reaction can be carried out under desirable conditions throughout the initial stage to the final stage, so that it is possible to appropriately fill the recess 10 of the substrate W with the plating metal 13.

Thus, the preceding electroless plating process can be performed under the conditions optimized to avoid 'thinning of the seed layer 11 due to corrosion of the seed layer 11 by the plating liquid', which is the concern in the early stage of the electroless plating reaction. Meanwhile, in the electroless plating process performed afterwards, it is possible to determine conditions appropriately without considering the need to avoid 'thinning of the seed layer 11 due to corrosion of the seed layer 11 by the plating liquid'.

Furthermore, even when the seed layer 11 is thin and discontinuous, by depositing the plating metal 13 on the bottom surface and the sidewall surface of the recess 10 in the preceding electroless plating process, a portion, among the surface defining the recess 10, where the seed layer 11 does not exist is also covered with the plating metal 13. As a result, in the electroless plating process performed thereafter, the recess 10 can be appropriately filled with the plating metal 13.

In addition, prior to supplying the preceding electroless plating liquid to the recess 10 of the substrate W, the preceding pretreatment liquid containing the reducing agent and the pH adjuster is supplied to the recess 10. The concentration of the reducing agent is set to be different between the pretreatment liquid L4 and the preceding pretreatment liquid.

Accordingly, the plating metal 13 can be precipitated on the substrate W from the preceding electroless plating liquid in a short time, so that corrosion of the seed layer 11 due to the preceding electroless plating liquid can be suppressed.

It should be noted that the exemplary embodiment and the modification example disclosed in the present specification are illustrative in all aspects and are not anyway limiting. The exemplary embodiment and the modification example described above may be omitted, replaced and modified in various ways without departing from the scope and the spirit of claims. For example, the above-described embodiment and modification example may be partially or entirely combined, and exemplary embodiments other than that described above may be partially or entirely combined with the above-described exemplary embodiment or modification example.

Further, the technical category that embodies the above-mentioned technical conception is not particularly limited. For example, the above-described substrate liquid processing apparatus may be applied to other apparatuses. Furthermore, the above-described technical conception may be embodied by a computer program for causing a computer to execute one or more procedures (steps) included in the above-described substrate liquid processing method. Alternatively, the above-described technical conception may be embodied by a computer-readable non-transitory recording medium on which such a computer program is recorded.

We claim:

1. A substrate liquid processing method, comprising:

preparing a substrate having a recess on a surface thereof, a seed layer being formed on a surface of the recess;

bringing a first pretreatment liquid, containing a reducing agent, a pH adjuster, and an additive configured to accelerate or inhibit an electroless plating reaction, into contact with the seed layer; and precipitating, after the bringing of the first pretreatment liquid into contact with the seed layer, a plating metal in the recess by supplying a first electroless plating liquid to the recess, wherein a concentration of the reducing agent in the first pretreatment liquid is higher than a concentration of a reducing agent in the first electroless plating liquid.

2. A substrate liquid processing method, comprising:

preparing a substrate having a recess on a surface thereof, a seed layer being formed on a surface of the recess;

bringing a first pretreatment liquid, containing a reducing agent, a Ph adjuster, and an additive configured to accelerate or inhibit an electroless plating reaction, into contact with the seed layer;

precipitating, after the bringing of the first pretreatment liquid into contact with the seed layer, a plating metal in the recess by supplying a first electroless plating liquid to the recess; and precipitating, prior to the bringing of the first pretreatment liquid into contact with the seed layer, a plating metal in the recess by supplying a second electroless plating liquid to the recess.

3. The substrate liquid processing method of claim 2, further comprising:

supplying, prior to the supplying of the second electroless plating liquid to the recess, a second pretreatment liquid containing a reducing agent and a pH adjuster to the recess, wherein a concentration of the reducing agent of the first pretreatment liquid is different from that of the second pretreatment liquid.

4. A computer-readable recording medium having stored thereon computer-executable instructions that, in response to execution, cause preparing a substrate having a recess on a surface of which a seed layer is formed, bringing a first pretreatment liquid containing a reducing agent, a pH adjuster, and an additive that accelerates or inhibits an electroless plating reaction into contact with the seed layer, and precipitating, after the bringing of the first pretreatment liquid into contact with the seed layer, a plating metal in the recess by supplying a first electroless plating liquid to the recess to be performed, wherein a concentration of the reducing agent in the first pretreatment liquid is higher than a concentration of a reducing agent in the first electroless plating liquid.

* * * * *